US011955328B2

(12) United States Patent
Wang et al.

(10) Patent No.: US 11,955,328 B2
(45) Date of Patent: Apr. 9, 2024

(54) METHOD AND APPARATUS FOR CLEANING SEMICONDUCTOR WAFER

(71) Applicant: ACM Research (Shanghai) Inc., Shanghai (CN)

(72) Inventors: Hui Wang, Shanghai (CN); Xi Wang, Shanghai (CN); Fuping Chen, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 0 days.

(21) Appl. No.: 17/724,948

(22) Filed: Apr. 20, 2022

(65) Prior Publication Data

US 2022/0246420 A1    Aug. 4, 2022

Related U.S. Application Data

(62) Division of application No. 16/645,171, filed as application No. PCT/CN2017/100983 on Sep. 8, 2017, now Pat. No. 11,335,550.

(51) Int. Cl.
*H01L 21/02* (2006.01)
*B08B 3/12* (2006.01)
*H01L 21/673* (2006.01)

(52) U.S. Cl.
CPC ............ *H01L 21/0206* (2013.01); *B08B 3/12* (2013.01); *H01L 21/02101* (2013.01); *B08B 2240/00* (2013.01); *H01L 21/673* (2013.01)

(58) Field of Classification Search
CPC ........... H01L 21/0206; H01L 21/02101; H01L 21/673; H01L 21/6719; H01L 21/67754; H01L 21/67757; H01L 21/68707; H01L 21/67057; B08B 3/12; B08B 2240/00; B08B 3/048

See application file for complete search history.

(56) References Cited

U.S. PATENT DOCUMENTS

| 4,092,176 A | * | 5/1978 | Kozai | ............... H01L 21/67051 |
| | | | | 134/186 |
| 4,736,758 A | * | 4/1988 | Kusuhara | ............... B01D 12/00 |
| | | | | 134/76 |
| 4,777,970 A | * | 10/1988 | Kusuhara | ............... B01D 12/00 |
| | | | | 392/394 |
| 5,341,825 A | * | 8/1994 | Kobayashi | ........ H01L 21/67057 |
| | | | | 134/182 |

(Continued)

FOREIGN PATENT DOCUMENTS

| CN | 202655283 U | * | 1/2013 | ......... H01L 21/0206 |
| CN | 104934350 A | * | 9/2015 | ......... H01L 21/0206 |

(Continued)

*Primary Examiner* — Mohammed Shamsuzzaman
(74) *Attorney, Agent, or Firm* — Osha Bergman Watanabe & Burton LLP

(57) ABSTRACT

A method for cleaning semiconductor wafer includes putting at least one wafer on a cassette bracket in a first cleaning tank filled with chemical solution; after said wafers have been processed in the first cleaning tank, transferring the wafers from the first cleaning tank to a second cleaning tank with the wafers immersing in the chemical solution; and after said wafers have been processed in the second cleaning tank, taking the wafers out of the second cleaning tank.

17 Claims, 18 Drawing Sheets

(56) References Cited

U.S. PATENT DOCUMENTS

| | | | | |
|---|---|---|---|---|
| 6,138,694 A * | 10/2000 | Hansen | ............ | H01L 21/67178 134/61 |
| 6,357,138 B2 * | 3/2002 | Nakabeppu | ....... | H01L 21/67034 34/340 |
| 6,530,385 B2 * | 3/2003 | Meuris | ............ | H01L 21/67057 134/32 |
| 9,595,457 B2 * | 3/2017 | Wang | ........................ | B08B 3/12 |
| 10,297,472 B2 * | 5/2019 | Wang | ................ | H01L 21/67057 |
| 11,037,805 B2 * | 6/2021 | Doong | ............ | H01L 21/67253 |
| 2003/0098047 A1 * | 5/2003 | Herbst | ............ | H01L 21/67313 134/201 |
| 2003/0230384 A1 * | 12/2003 | Su | .................... | H01L 21/67781 156/345.22 |
| 2004/0050491 A1 * | 3/2004 | Miya | ................ | H01L 21/67051 156/345.11 |
| 2006/0201532 A1 * | 9/2006 | Shirazi | ............ | H01L 21/67057 134/1 |
| 2007/0277930 A1 * | 12/2007 | Yokoyama | ........ | H01L 21/67051 156/345.31 |
| 2008/0181750 A1 * | 7/2008 | Moriya | ............. | H01L 21/67126 414/217.1 |
| 2009/0320875 A1 * | 12/2009 | Martinez | ........... | H01L 21/67051 134/184 |
| 2013/0223180 A1 * | 8/2013 | Komiya | .................. | B01F 35/71 366/132 |
| 2013/0309045 A1 * | 11/2013 | Kobayashi | ........ | H01L 21/67184 414/217 |
| 2015/0332940 A1 * | 11/2015 | Wang | ................ | H01L 21/67057 134/25.1 |
| 2016/0265846 A1 * | 9/2016 | Tice | .................. | H01L 21/67781 |

FOREIGN PATENT DOCUMENTS

| | | | | | |
|---|---|---|---|---|---|
| JP | | 2002093764 A | * | 3/2002 | .......... H01L 21/0206 |
| JP | | 2011230097 A | * | 11/2011 | ......... H01L 21/0206 |
| TW | | 200522182 A | * | 7/2005 | ....... H01L 21/02057 |
| TW | | 201545228 A | * | 12/2015 | ......... H01L 21/0206 |
| TW | | 201630102 A | * | 8/2016 | ............. H01L 51/56 |
| TW | | 201703887 A | * | 2/2017 | ............. B08B 11/04 |
| WO | WO-2004046418 A1 | | * | 6/2004 | ........ C23C 18/1628 |

* cited by examiner

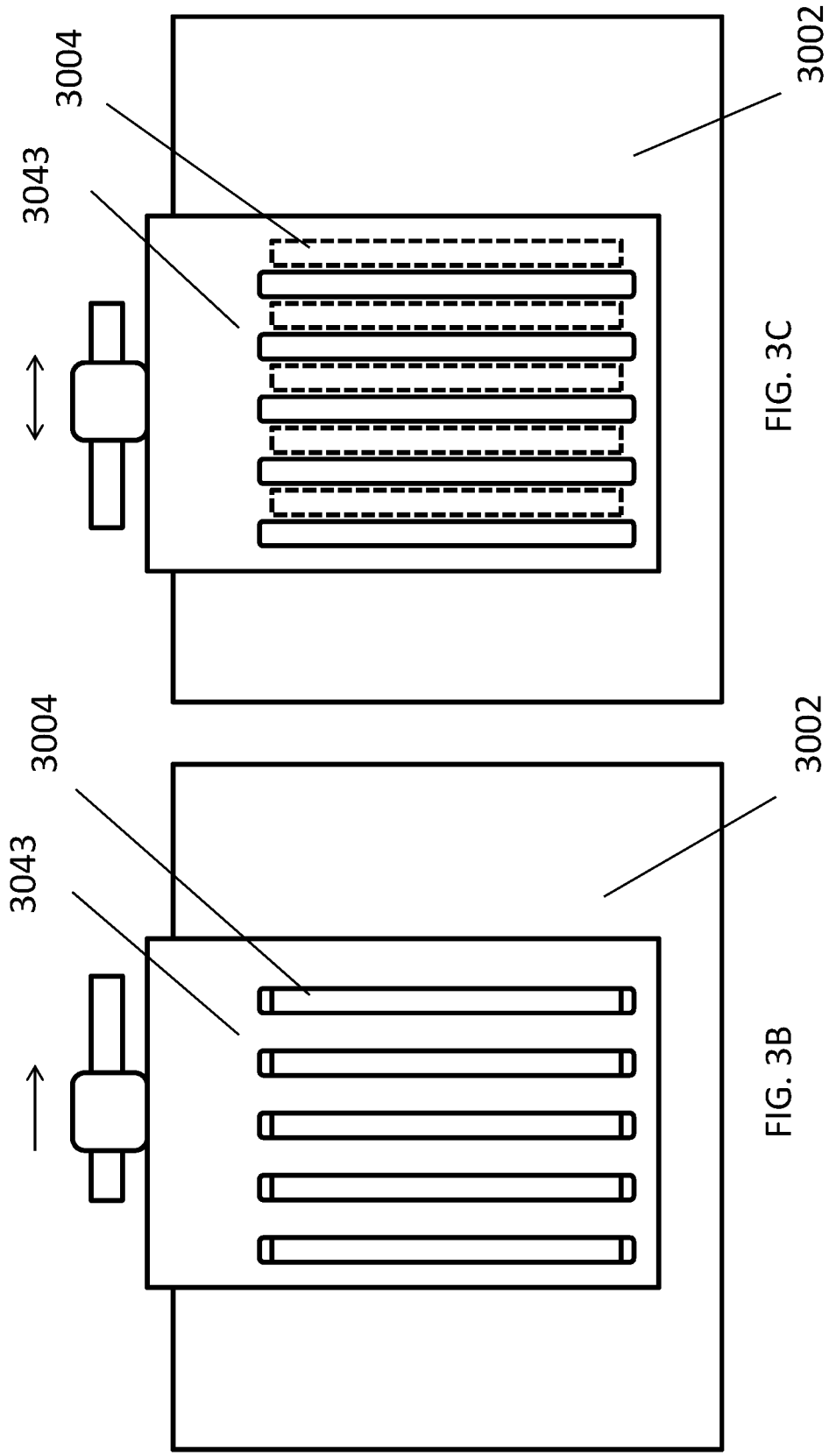

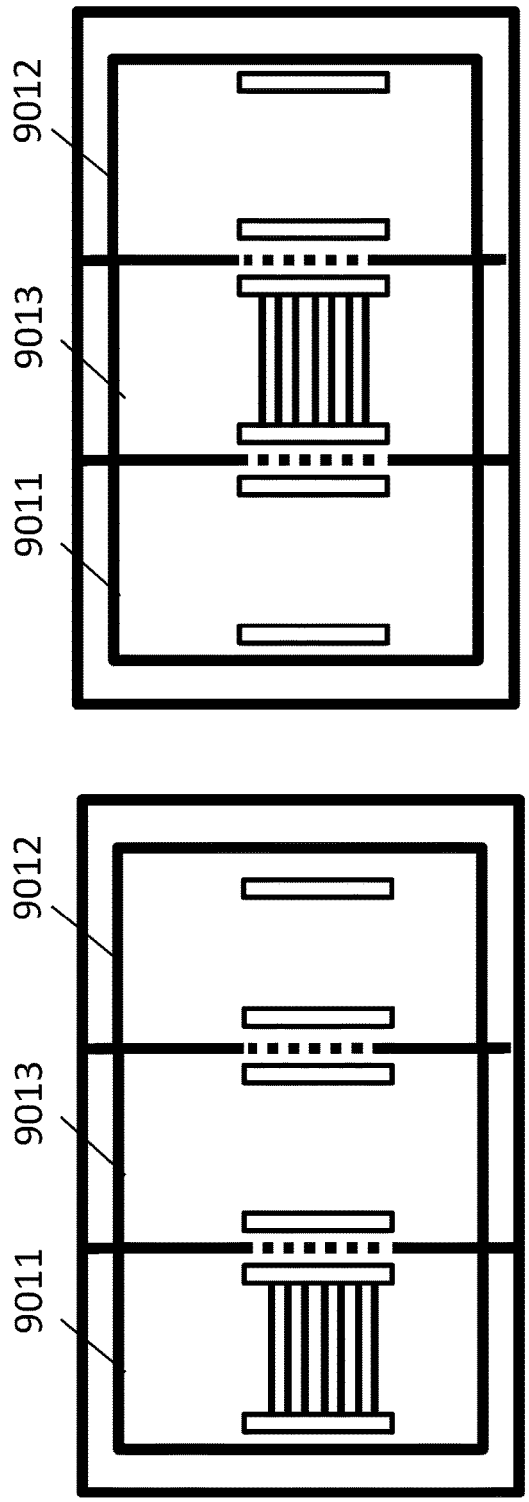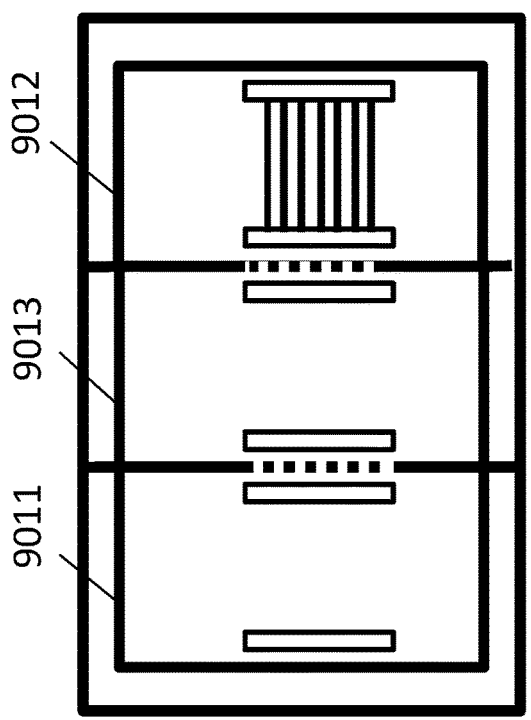
FIG. 9A
FIG. 9B
FIG. 9C

METHOD AND APPARATUS FOR CLEANING SEMICONDUCTOR WAFER

CROSS-REFERENCE TO RELATED APPLICATIONS

This application is a divisional application of U.S. patent application Ser. No. 16/645,171, filed on Mar. 6, 2020, which is a national phase application of PCT/CN2017/100983, filed on Sep. 8, 2017. The contents of these applications are hereby incorporated by reference in their entirety.

FIELD OF THE INVENTION

The present invention generally relates to the field of semiconductor devices manufacture, and more particularly to a method and an apparatus for cleaning semiconductor wafer.

BACKGROUND

During the integrated circuit fabrication process, a wet cleaning process is essential for obtaining high quality integrated circuits. After a dry etching process, a wafer needs to be cleaned to remove residual photoresist, organics produced during the dry etching process, and film material attached on a surface of the wafer. The main chemical solution for cleaning the wafer includes SC1, BOE and SPM which is a mixture of $H_2SO_4$ and $H_2O_2$. Thereinto, the temperature of SPM is higher than 90° C. and the SPM is used for removing the residual photoresist and organics. Generally, there are two ways to clean the wafer. One is batch cleaning and the other is single wafer cleaning, both of which will be comparatively described.

The batch cleaning is capable of cleaning a plurality of wafers every time. An apparatus for batch cleaning includes mechanical transmission devices and several cleaning tanks. A plurality of wafers can be cleaned in one of the cleaning tanks simultaneously, so the efficiency of batch cleaning is high and about four hundred wafers can be cleaned per hour. Moreover, because the chemical solution in the cleaning tanks is circulated, therefore, the chemical solution can be reused and the cost of batch cleaning is reduced, especially for high temperature chemical solution, such as 120° C. SPM, because the high temperature SPM is more difficult to blend and control its concentration and temperature. The cleaning cost is reduced by using batch cleaning. However, with the line width of integrated circuit shrinking continuously, the disadvantages of the batch cleaning are exposed visibly. During the batch cleaning process, the wafers need to be taken out from one cleaning tank to other cleaning tanks. At this time, if the chemical solution in the cleaning tanks has some tiny impurities, such as organic residues, organic contaminants, particles, the tiny impurities will adhere to the surfaces of the wafers along with the chemical solution. Once the wafers are dried or exposure to any gas phase atmosphere, the tiny organic contaminants on the wafers are very hard to remove.

The single wafer cleaning can only clean a piece of wafer every time. An apparatus of single wafer cleaning includes mechanical transmission devices and several independent single wafer cleaning modules. The cleaning and drying processes of one wafer are finished in one single wafer cleaning module. After cleaning a piece of wafer, the chemical solution in the single wafer cleaning module is drained and new chemical solution is supplied to clean another piece of wafer, avoiding cross contaminant. The single wafer cleaning can effectively remove particles and film material. However, the single wafer cleaning has a limitation in use of high temperature chemical solution, such as SPM which temperature is higher than 90° C., because the high temperature chemical solution is hard to recycle.

Both the batch cleaning and the single wafer cleaning have their own advantages and disadvantages. Therefore, inventing a new apparatus and method which combine the advantages of the batch cleaning and the single wafer cleaning will be a great contribution to the integrated circuit fabrication process.

SUMMARY

Accordingly, an object of the present invention provides an apparatus and method which ensure the wafers immersing in the chemical solution from one cleaning tank to other cleaning tanks.

In one embodiment, the apparatus includes an inner tank; at least one divider for dividing the inner tank into at least two cleaning tanks filled with chemical solution; a first robot equipped with at least a pair of end effectors for gripping and taking a wafer from a first cleaning tank to a second cleaning tank; wherein each cleaning tank is provided with a cassette bracket in the bottom for holding wafers, and the at least one divider is provided with at least one slot; wherein the first robot grips and takes the wafer from the first cleaning tank to the second cleaning tank through the slot while keeping the wafer immersing in the chemical solution.

According to one embodiment, a method for cleaning semiconductor wafer includes following steps:
putting at least one wafer on the cassette bracket in a first cleaning tank filled with chemical solution;
after said wafers have been processed in the first cleaning tank, transferring the wafers from the first cleaning tank to a second cleaning tank with the wafers immersing in the chemical solution; and
after said wafers have been processed in the second cleaning tank, taking the wafers out of the tank.

The present invention utilizes several slots in the divider for transferring wafers, ensuring the wafer immersing the chemical solution from one tank to the other tank.

BRIEF DESCRIPTION OF THE DRAWINGS

FIG. 3B depicts another exemplary divider with more than one slots when the door is in the opening status;

FIG. 3C depicts another exemplary divider with more than one slots when the door is in the closing status;

FIGS. 9A-9C depict another exemplary wafer cleaning method.

DETAILED DESCRIPTION

Preferred embodiments of this invention will be described in detail hereinafter with reference to the drawings. The embodiments of the present invention described are not limit the invention to the precise forms disclosed in the following detailed description.

Figure 1A:
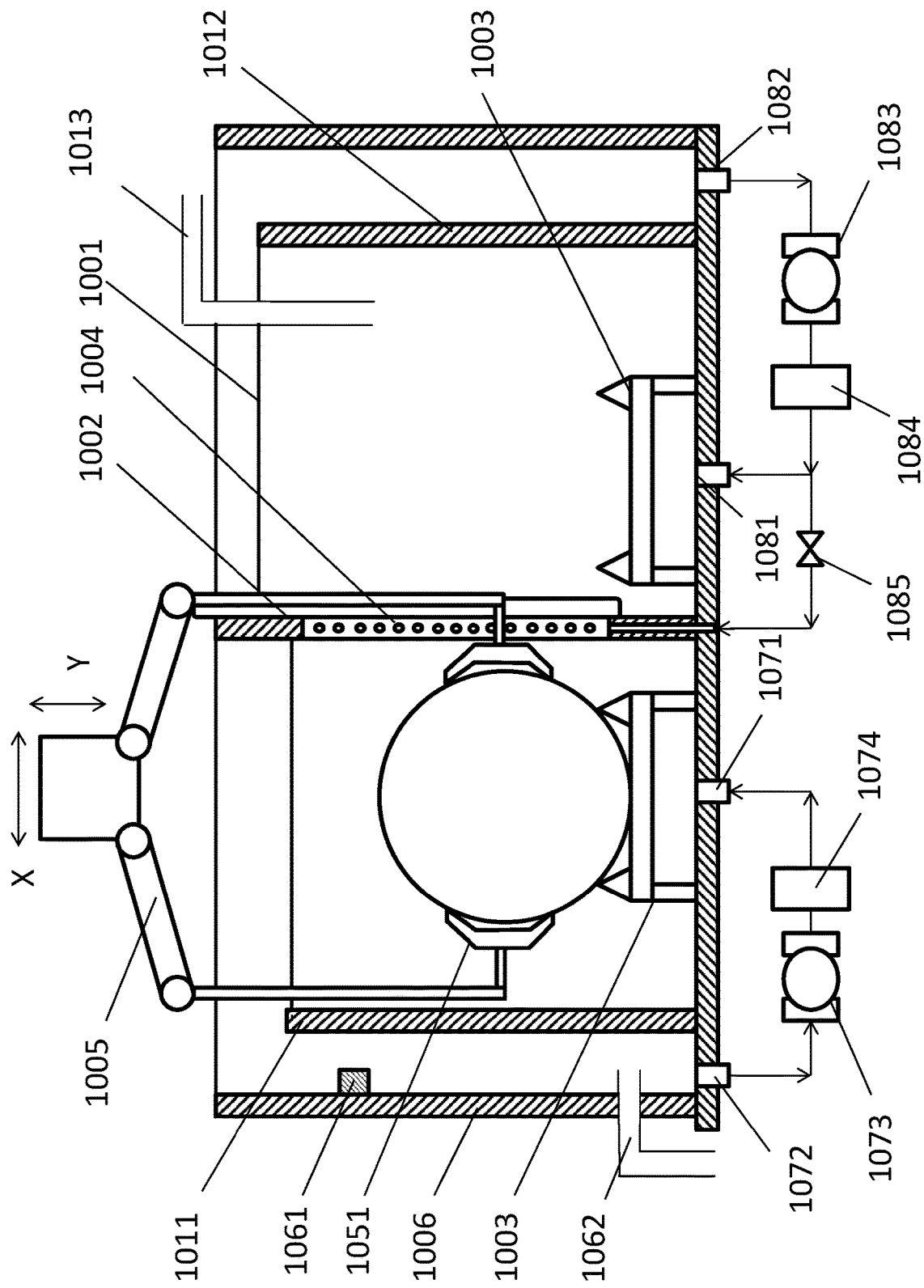
FIG. 1A-1C depict a cross sectional view showing the exemplary apparatus for cleaning wafers during transferring process.

FIG. 1A depicts a cross sectional view showing an exemplary apparatus for cleaning semiconductor wafer according to the present invention. The apparatus for cleaning semiconductor wafer comprises an inner tank 1001; at least one divider 1002 for dividing the inner tank 1001 into at least two cleaning tanks filled with chemical solution; a first robot 1005 equipped with at least a pair of end effectors 1051 for gripping and taking a wafer from a first cleaning tank 1011 to a second cleaning tank 1012; wherein each cleaning tank is provided with a cassette bracket 1003 in the bottom for holding wafers, and the at least one divider 1002 is provided with at least one slot 1004; wherein the first robot 1005 grips and takes the wafer from the first cleaning tank 1011 to the second cleaning tank 1012 through the slot 1004 while keeping the wafer immersing in the chemical solution.

The chemical solution in the cleaning tanks is hot SPM, and the temperature of the hot SPM is in the range of 80° C.-250° C. The temperature of the chemical solution in different cleaning tanks is same or not. SPM is mixture of $H_2SO_4$ and $H_2O_2$, and the ratio of $H_2O_2$ to $H_2SO_4$ is 1:1 to 1:100. The concentration of the chemical solution in different cleaning tanks is same or not.

In order to avoid the dirty chemical solution in the first cleaning tank 1011 flowing to the second cleaning tank 1012, two cleaning tanks have different liquid level that the height of the first cleaning tank 1011 is lower than the second cleaning tank 1012. Because of the liquid level difference between the first cleaning tank 1011 and the second cleaning tank 1012, the pressure of chemical solution in second cleaning tank 1012 P2 is higher than the pressure of chemical solution in the first cleaning tank 1011 P1, wherein a bias pressure $\Delta P=P2-P1>0$ is formed between the first cleaning tank 1011 and the second cleaning tank 1012, P2>P1. Due to the bias pressure $\Delta P$, the chemical solution in the second cleaning tank 1012 intends to flow to the first cleaning tank 1011. And the second cleaning tank 1012 has an inlet 1013 for supplying fresh chemical solution to the second cleaning tank 1012 to keep the liquid level difference between two cleaning tanks.

The apparatus further comprises an outer tank 1006. Each cleaning tank is connected to the outer tank 1006 through recycle system separately. The recycle system connected to the first cleaning tank 1011 comprises an inlet nozzle 1071, an outlet 1072, a pump 1073 and a filter 1074. The inlet nozzle 1071 is in the bottom of the first cleaning tank 1011, and the outlet 1072 is in the bottom of the outer tank 1006. The recycle system connected to the second cleaning tank 1012 comprises an inlet nozzle 1081, an outlet 1082, a pump 1083, a filter 1084 and a valve 1085. The inlet nozzle 1081 is in the bottom of the second cleaning tank 1012, and the outlet 1082 is in the bottom of the outer tank 1006. The valve 1085 is connected to the liquid channel 1042 in the divider 1002 for controlling the supply of chemical solution. In cleaning process, the chemical solution in the first cleaning tank 1011 becomes more and more dirty. The dirty chemical solution in the first cleaning tank 1011 overflows to the outer tank 1006, and the dirty liquid chemical in outer tank 1006 flows into the recycle system through outlet 1072. The recycle system purifies the dirty chemical solution by filter 1074, and the clean chemical solution will be sprayed back to the cleaning tank through the inlet nozzle 1071 by pump 1073. In this way, the chemical solution in the cleaning tank will stays clean all the time. Further, the height of divider 1002 is not lower than the height of cleaning tanks for avoiding the cross contamination between two cleaning tanks.

The outer tank 1006 further comprises a sensor 1061 and a drain 1062 under the sensor 1061. The sensor 1061 is used to detect the liquid level of the chemical solution in outer tank 1006. The inlet 1013 supplies fresh chemical solution to the second cleaning tank 1012 continuously, and the chemical solution in second cleaning tank 1012 flows to the first cleaning tank 1011, then the chemical solution in the first cleaning tank 1011 overflows to the outer tank 1006. When the sensor 1061 detects the liquid level rising to the defined height, the drain 1062 will open to drain the chemical solution till the liquid level lower than the defined height.

Figure 1B:
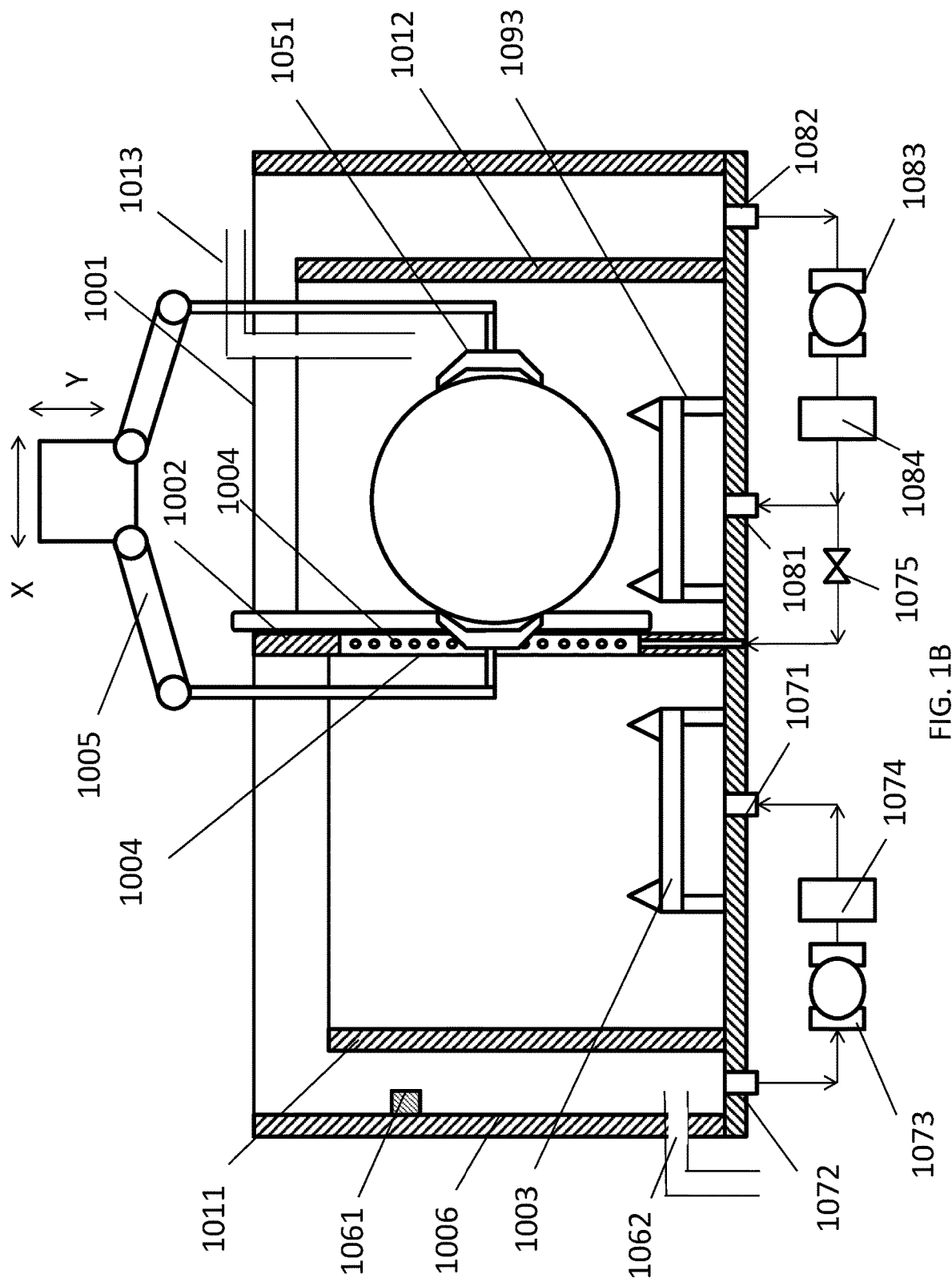
Figure 1C:
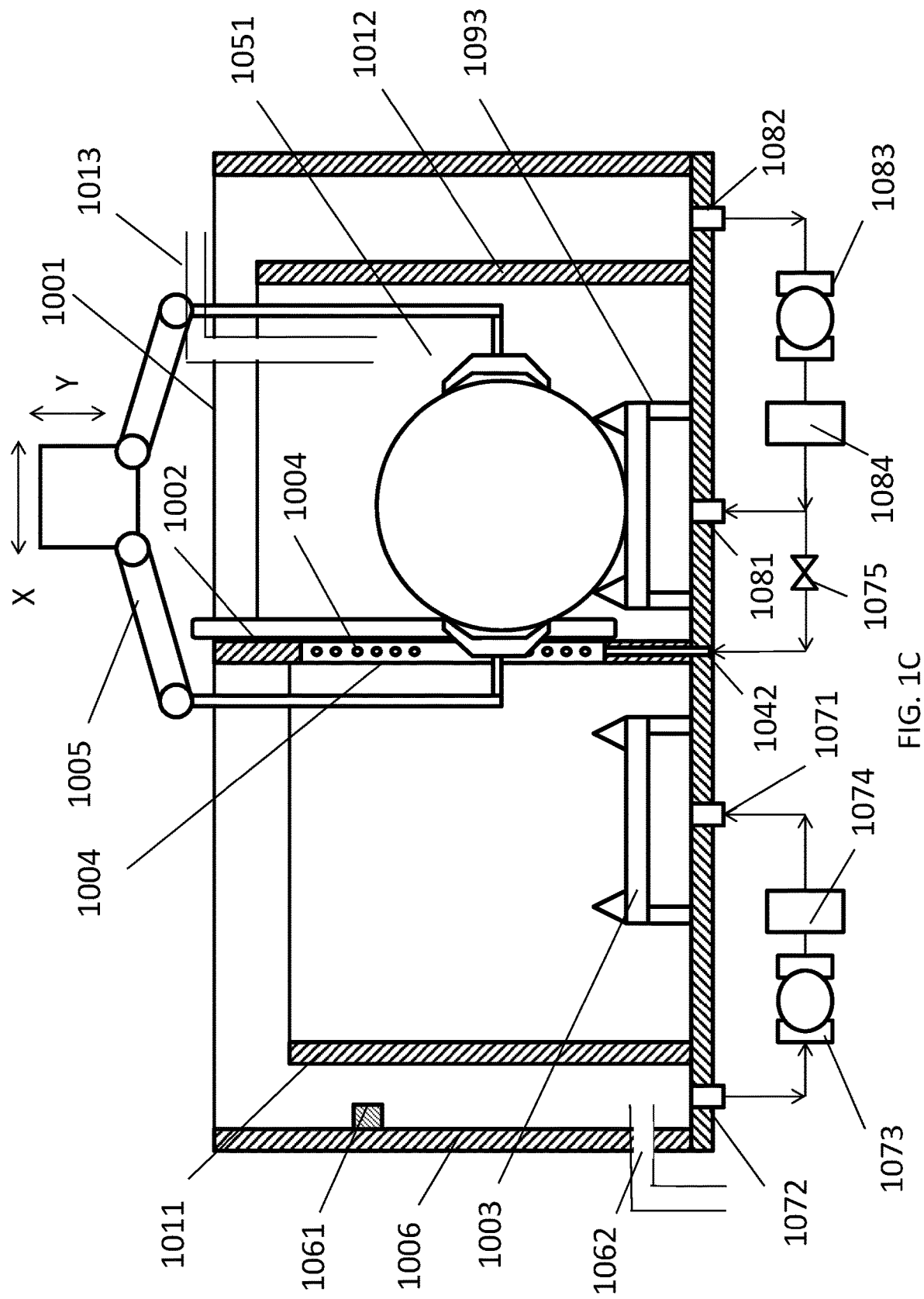

FIG. 1A-1C depicts the working process of the first robot 1005. After the cleaning process has finished, putting the first robot 1005 into two adjacent cleaning tanks. Each pair of the end effectors 1051 is placed across two adjacent cleaning tanks. Several pairs of the end effectors 1051 grip the wafers at the same time, and the first robot 1005 lifts the wafers up to a certain height. Then the first robot 1005 moves horizontally with the wafers to take the wafers from the first cleaning tank 1011 to the second cleaning tank 1012 through the slots 1004 in the divider 1002. Dropping the wafers down by the first robot 1005 and putting the wafers in the cassette bracket 1003 in the second cleaning tank.

Figure 2A:
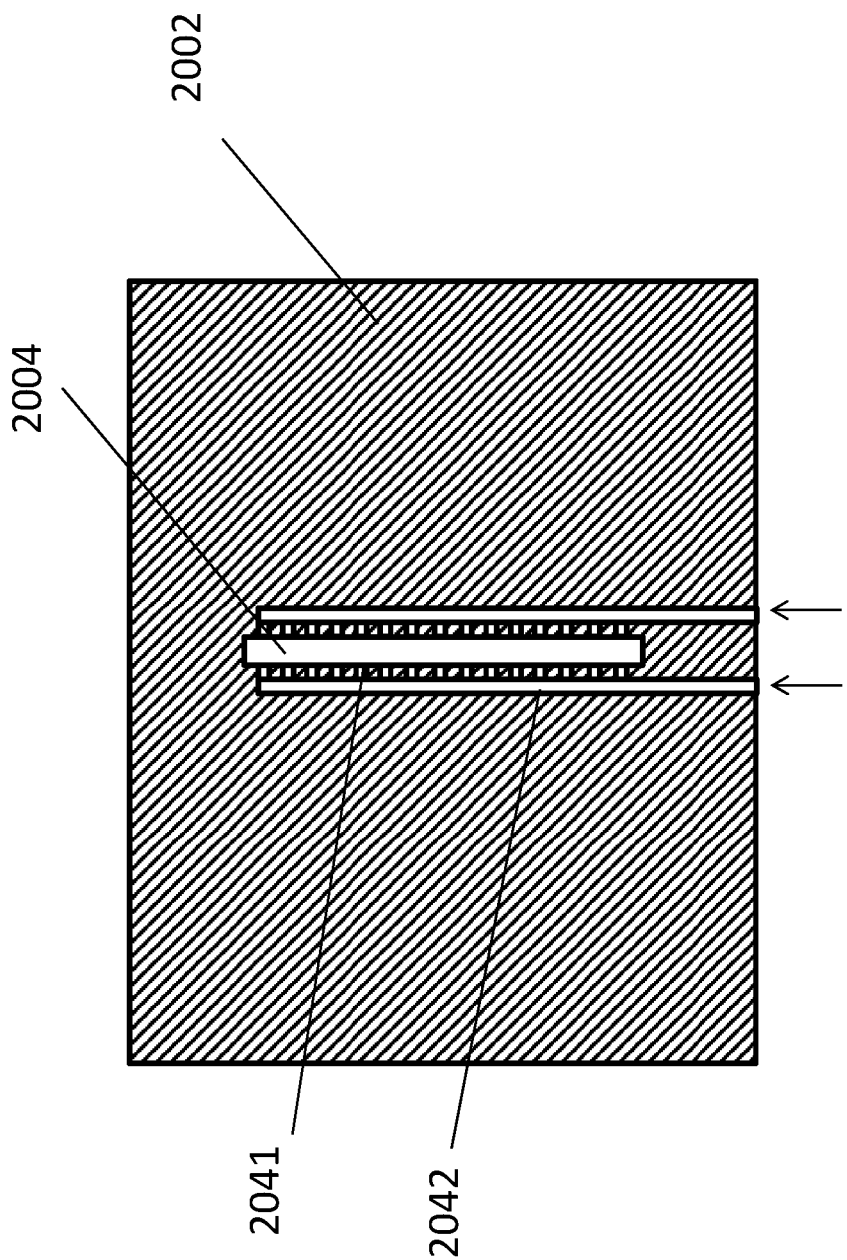
FIG. 2A depicts a cross sectional view showing an exemplary divider with one slot.
Figure 2C:
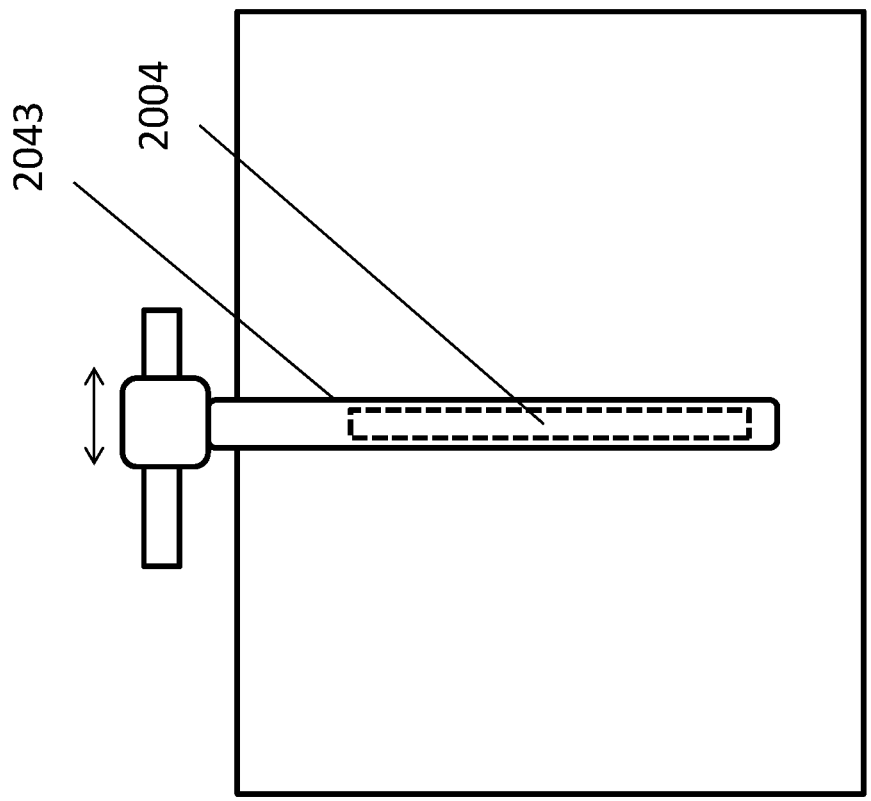
FIG. 2C depicts an exemplary divider with one slot when the door is in the closing status.
Figure 2B:
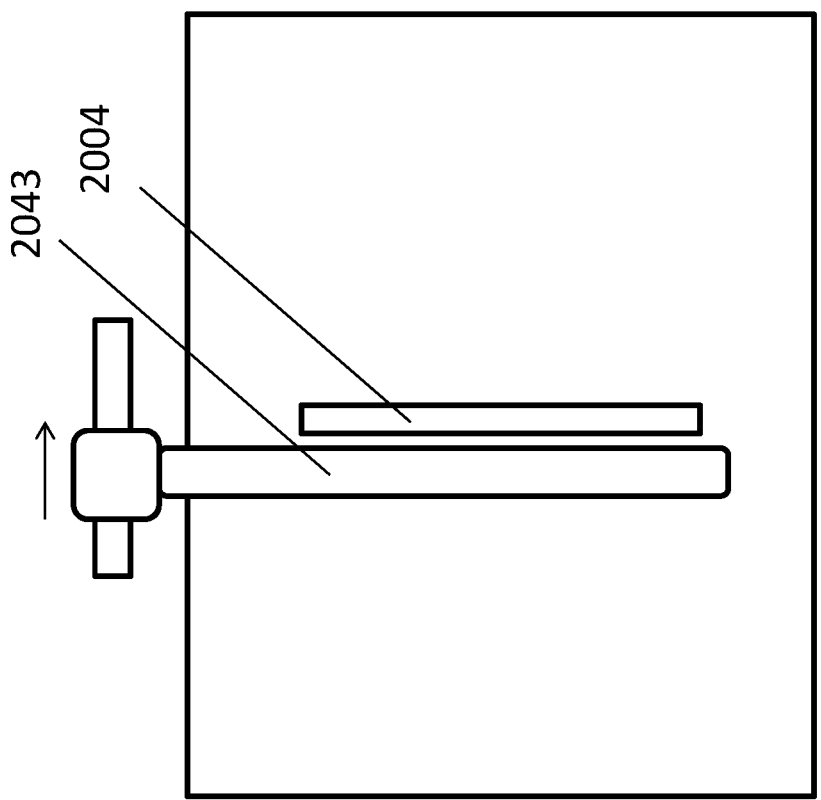
FIG. 2B depicts an exemplary divider with one slot when the door is in the opening status.

The divider 1002 with the slot 1004 prevent of the wafers being exposure to any gas phase atmosphere during the wafers transferring from one tank to the other tank, but the dirty chemical liquid in the first cleaning tank 1011 will flow into the second cleaning tank 1012 through the slot. FIG. 2A depicts a cross sectional view showing an exemplary divider 102 with one slot 2004. The side wall of the slot 2004 has an array of nozzles 2041. The nozzles 2041 are supplied the chemical solution from recycle system through the liquid channel 2042, and the valve of the recycle system keeps open. When the wafer goes through the slot 2004, both sides of the wafer will be sprayed by the fresh chemical solution from the nozzle 2041. Besides, the chemical solution sprayed from the nozzles 2041 will form a liquid curtain blocking the slot 2004, and the liquid curtain will prevent the dirty chemical solution flowing to the clean chemical solution through the slot 2004. And the pressure bias between the two cleaning tanks also contributes to minimize the dirty chemical solution from the first cleaning tank flow to the second cleaning tank. For further blocking the slot 2004 to avoid the dirty chemical flow into the clean chemical liquid, the apparatus further comprises an exemplary slot door 2043, as FIG. 2B and FIG. 2C. The slot door 2043 is driven by driving device for sealing or opening the slot 2004. When the wafers have been processed, open the slot door 2043, then spray the chemical solution from the nozzle 2041 and transfer the wafers one by one. In other cases, the slot door 2043 are closed.

Figure 3A:
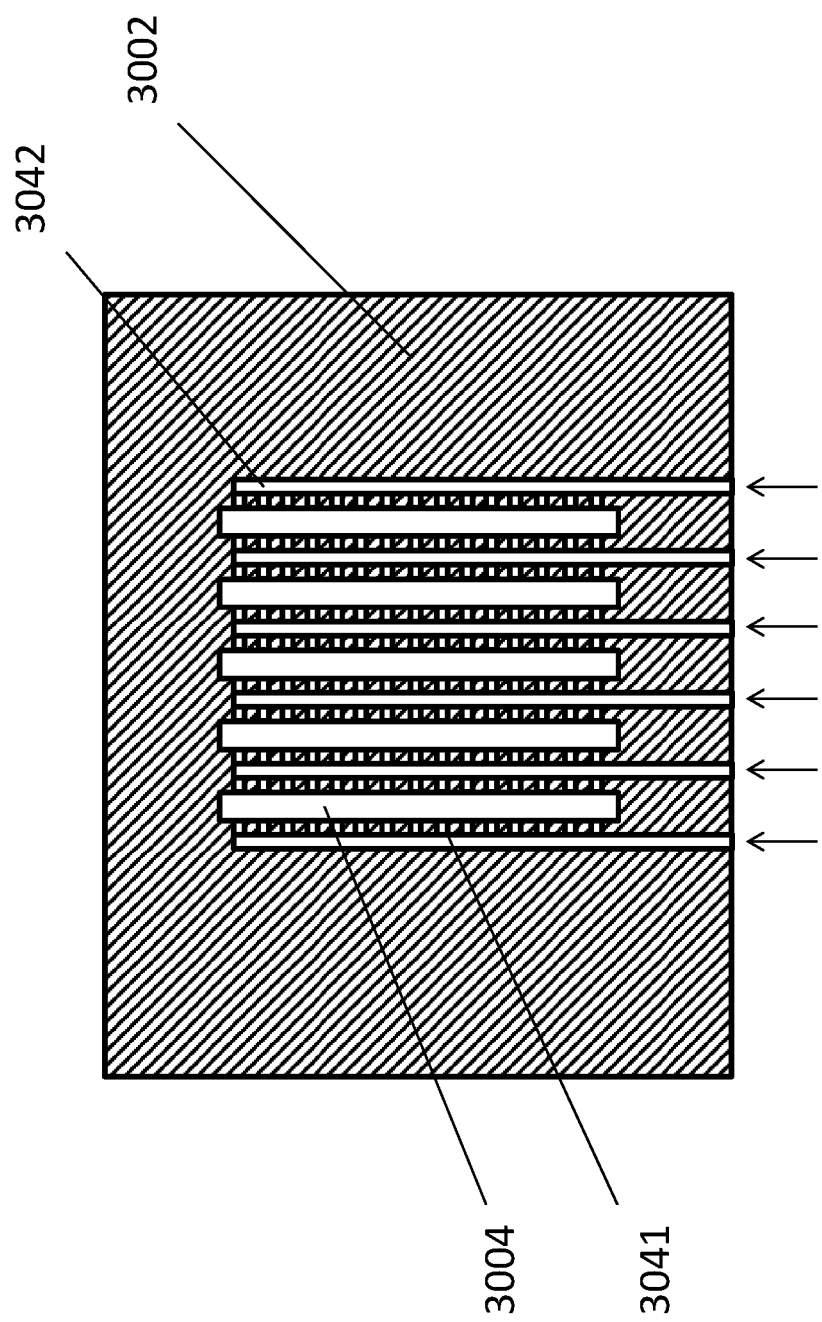
FIG. 3A depicts a cross sectional view showing another exemplary divider with more than one slots.

FIG. 3A depicts a cross sectional view showing another exemplary divider 3002 with more than one slot 3004. The side wall of every slot 3004 has an array of nozzles 3041. The nozzles 3041 are supplied the chemical solution from recycle system through the liquid channel 3042, and the valve of the recycle system keeps open. When the wafers go through the slots 3004, both sides of the wafers will be sprayed by the fresh chemical solution from the nozzle 3041. Besides, the chemical solution sprayed from the nozzles 3004 will form liquid curtain blocking the slots 3004, and the liquid curtain will prevent the dirty chemical solution flowing to the clean chemical solution through the slots 3004. And the pressure bias between the two cleaning tanks also contributes to minimize the dirty chemical solution from the first cleaning tank flow to the second cleaning tank. For further blocking all the slots 3004 to avoid the dirty chemical solution flow into the clean chemical liquid, the apparatus further comprises another exemplary slot door 3043, as FIG. 3B and FIG. 3C. The slot door 3043 has several openings 3044, and the number of the openings 3044 is no less than the number of the slots 3004 in the divider 3002. The size of the openings 3044 is no less than the size of the slots 3004 in the divider 3002. The slot door 3043 is driven by driving device for sealing or opening the slots 3004. When the wafers have been processed, move the slot door 3043 till the openings 3044 overlap the slots 3004, then spray the chemical solution from the nozzle 3041 and transfer the wafers. In other cases, the slots 3004 and the openings 3044 are staggered.

Figure 4A:
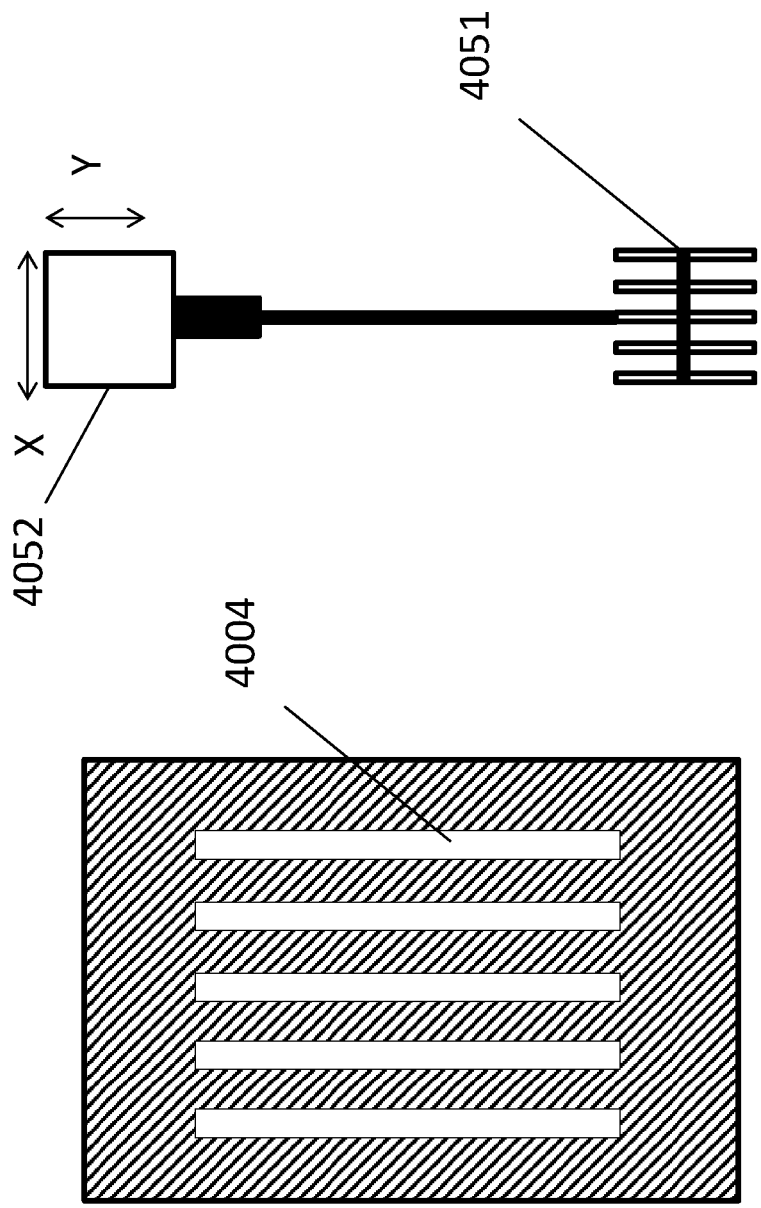
FIG. 4A depicts the side view showing the divider with vertical slots and the robot corresponding the slots.
Figure 4B:
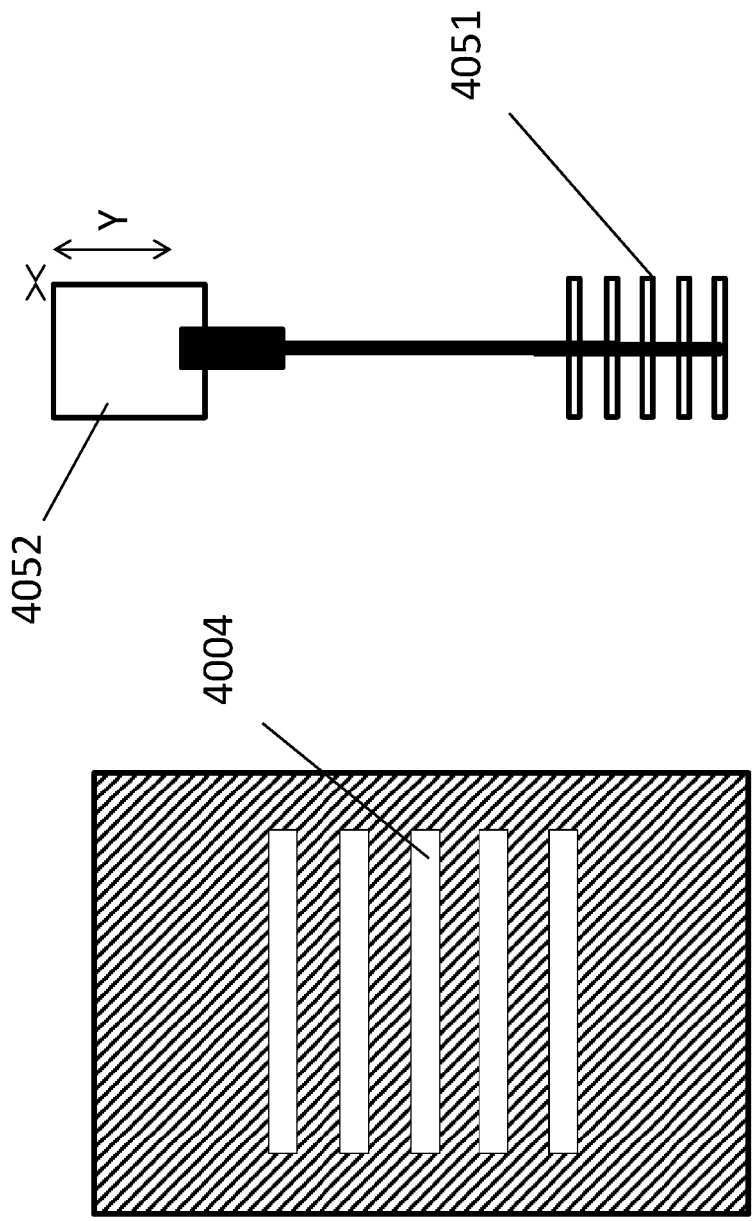
FIG. 4B depicts the side view showing the divider with horizontal slots and the robot corresponding the slots.
Figure 4C:
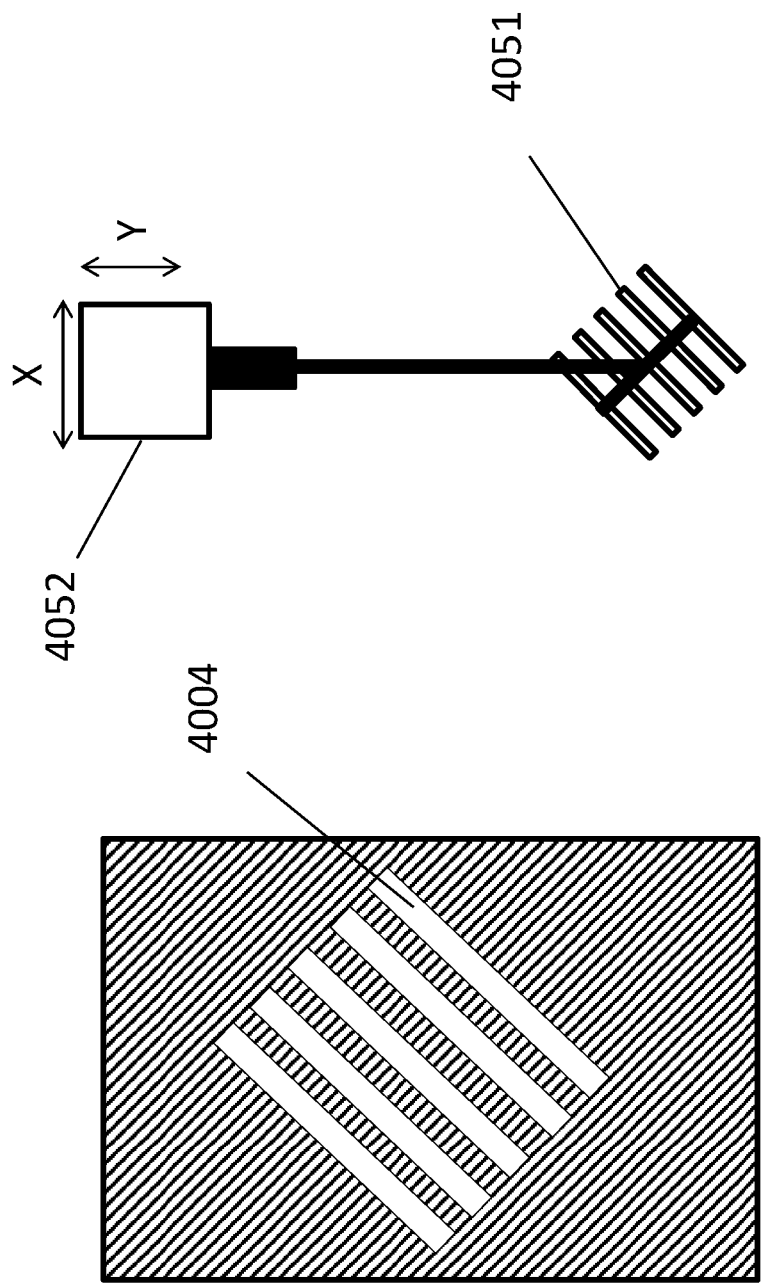
FIG. 4C depicts the side view showing the divider with the slots having an angle to horizontal and the robot corresponding the slots.

If the first robot equipped with a pair of end effectors, the wafers will be transferred one by one. In order to increase the transfer efficiency, the number of the pairs of the end effectors is the same as the number of wafers that all the wafers can be transferred one time. Preferably, the number of the pairs of end effectors is five to twenty-five. The shape of the first robot is like a rake, as FIG. 4A-4C. The first robot comprises a driving device 4052 for driving the first robot and moving up and down. The first robot is used for gripping and taking the wafers from the first cleaning tank to the second cleaning tank. The shape of the first robot is conducive to every pair of the end effectors 4051 through one slot, so the number of the pairs of the end effectors 4051 can't be more than the number of the slots. FIG. 4A-4C depict the side view showing the divider with the slots in different direction and the robot corresponding the slots. FIG. 4A depicts the slots 4004 are vertical, and the direction of the end effectors 4051 is vertical. The number of the pairs of the end effectors 4051 is five, and the number of the slots 4004 is five. In this case, the wafers are placed vertical on the cassette bracket, and the inlet nozzle is placed at the bottom of the cleaning tank. FIG. 4B depicts the slots 4004 are horizontal, and the direction of the end effectors 4051 is horizontal. The number of the pairs of the end effectors 4051 is five, and the number of the slots 4004 is five. In this case, the wafers are placed horizontal on the cassette bracket, and the inlet nozzle is placed at the side wall of the cleaning tank. FIG. 4C depicts the slots 4004 have an angle to the horizontal, and the direction of the end effectors 4051 is the same as the slots 4004. The number of the pairs of the end effectors 4051 is five, and the number of the slots 4004 is five. In this case, the wafers are placed with an angle to the horizontal on the cassette bracket. The angle of the wafers to the horizontal is same as the angle of the slots 4004 to the horizontal, and the inlet nozzle is directing an angle to the horizontal.

Figure 5:
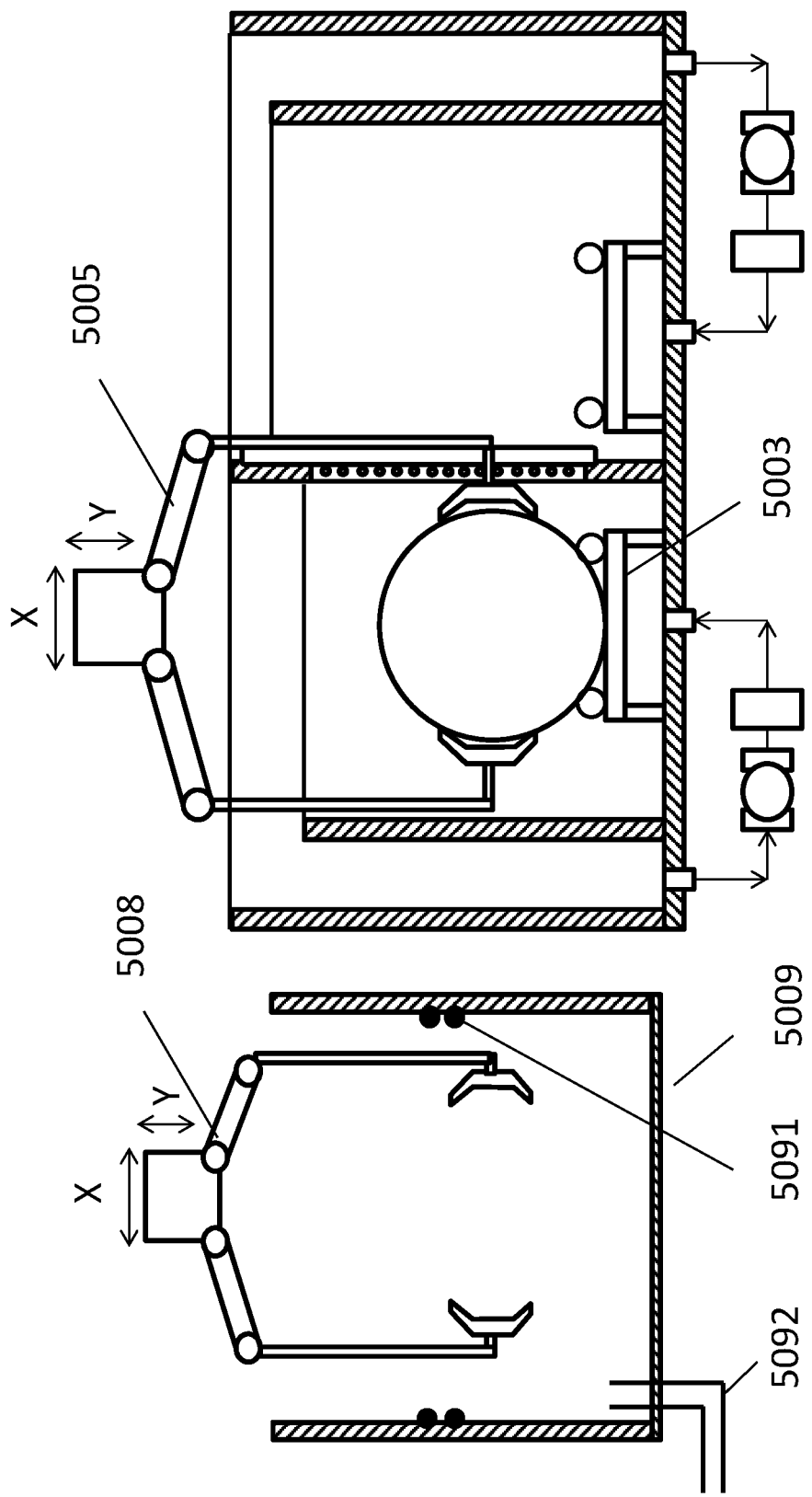
FIG. 5 depicts a cross sectional view showing the exemplary apparatus with an external cleaning tank.

Considering the first robot can only take the wafers up to a certain height, the apparatus comprises a second robot 5008 for loading and unloading the wafers. FIG. 5 depicts a cross sectional view showing the exemplary apparatus with an external cleaning tank. Before the cleaning process start, putting the wafers on the cassette bracket 5003 in the cleaning tank by the second robot 5008. After the total cleaning process has done, taking the wafers out of the cleaning tank by the second robot 5008. The second robot 5008 is placed in the external cleaning tank 5009 in the non-working status. The side wall of the external cleaning tank 5009 has several sprayers 5091 spraying DI water or fresh chemical solution for flushing the second robot 5008. The external cleaning tank 5009 has an outfall 5092 located at the bottom of the external cleaning tank 5009 for draining the dirty chemical solution. The external cleaning tank 5009 is also used for cleaning the first robot 5005.

Figure 6A:
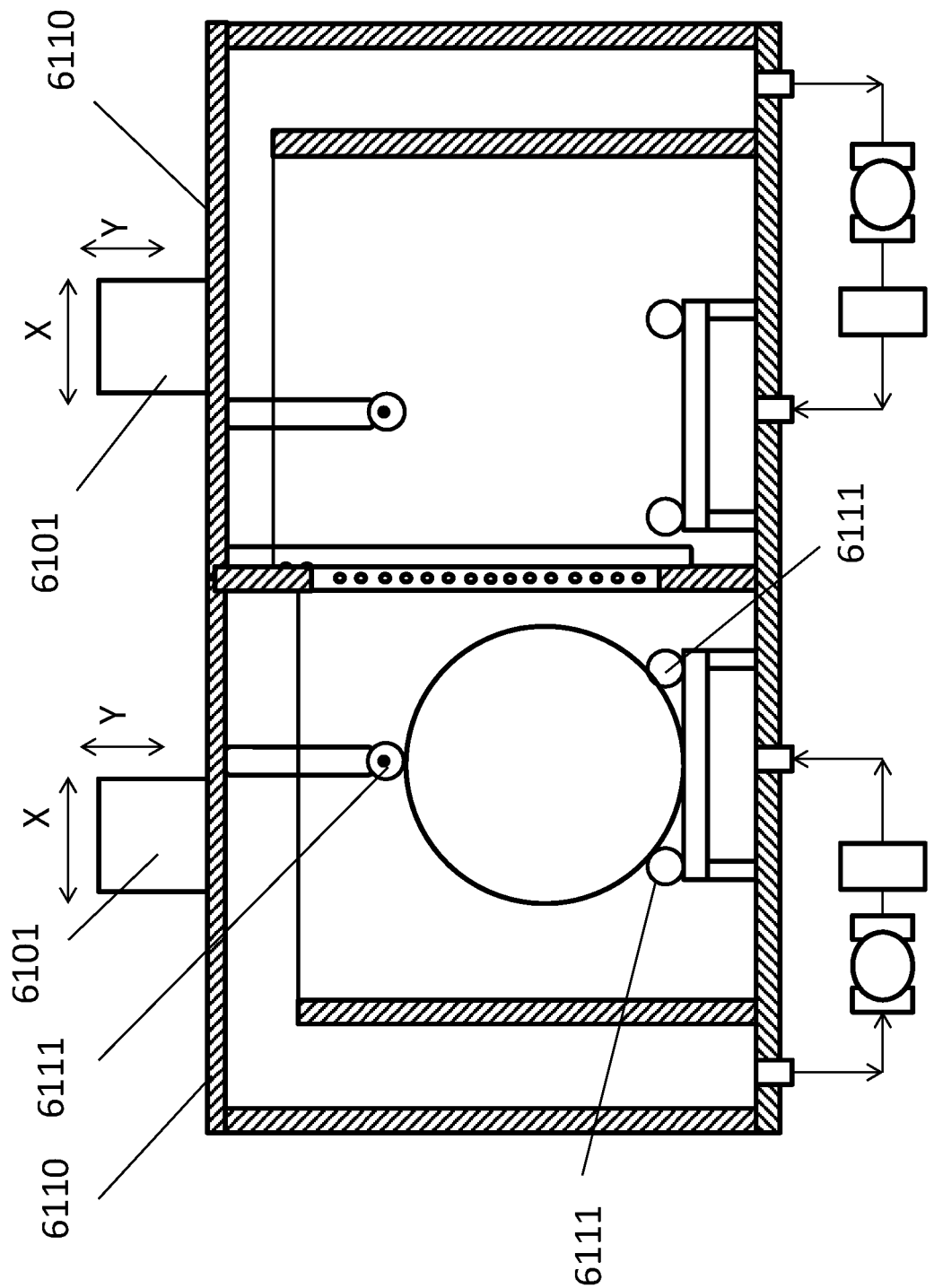
FIG. 6A depicts a cross sectional view showing the exemplary apparatus for cleaning wafers during cleaning process.
Figure 6B:
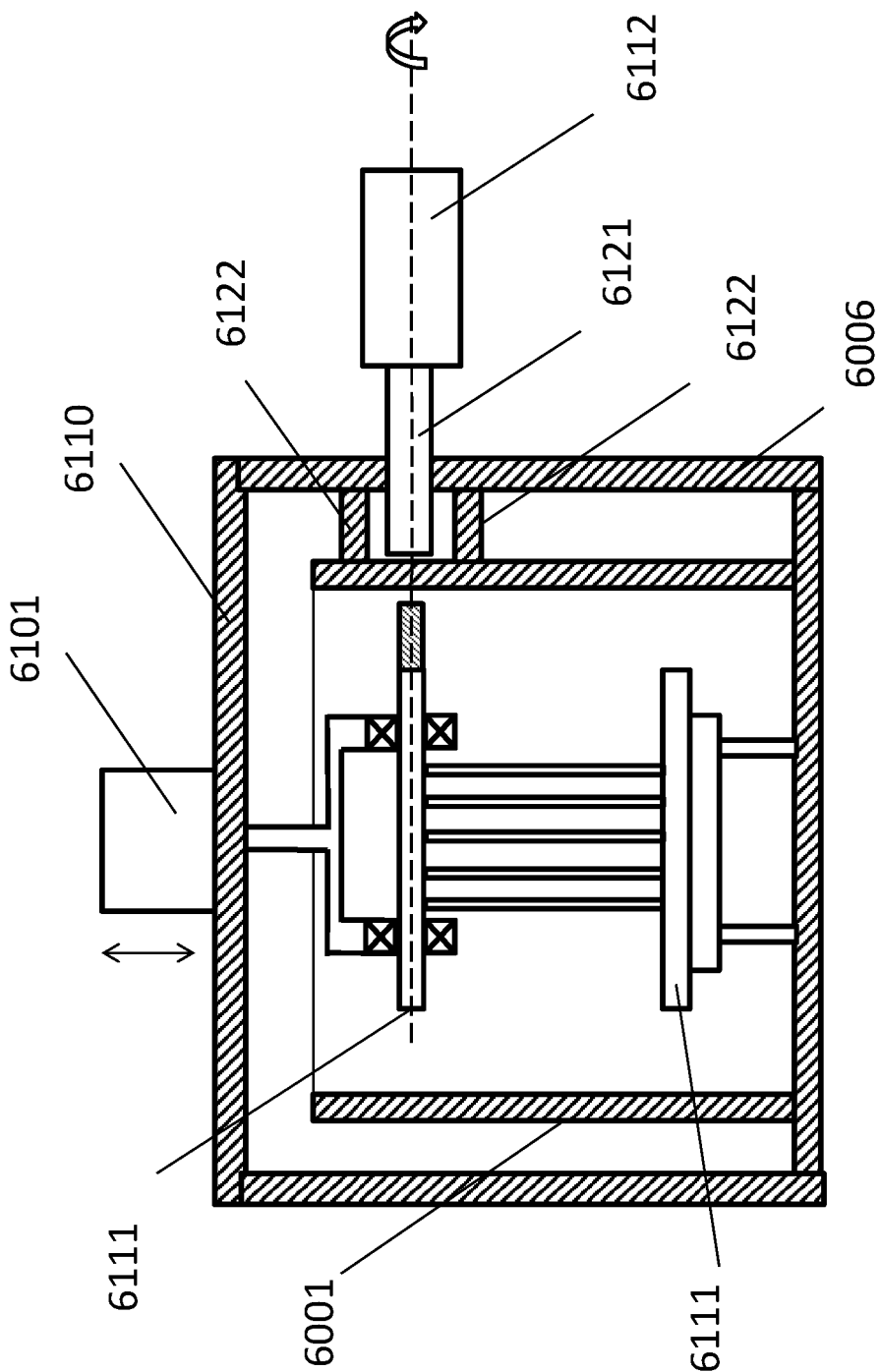
FIG. 6B depicts a side view showing the magnetic drive structure of exemplary apparatus for cleaning wafers during cleaning process.

FIG. 6A depicts a cross sectional view showing the exemplary apparatus for cleaning wafers during cleaning process. Each cleaning tank has a cover plate 6110 for avoiding the chemical solution leakage out or chemical vapors go out to other areas of the apparatus in cleaning process. The cover plate 6110 has a cylinder 6101 used for driving the cover plate 6110 up and down. As the fluid flow sprayed from the inlet nozzle and goes out of the cleaning tank, the flow circulation causes the vibration of the wafers on the cassette bracket. The vibration cause the wafer bouncing up and down on the cassette bracket, which leads to the defects on the contact points between wafers and the cassette bracket. In order to solve the problem, the wafers are locked by three sticks 6111. One of the three sticks 6111 is connected with the cover plate 6110, so the stick 6111 connected with the cover plate 6110 press down on the wafers to clamp the wafers to seating on the cassette bracket. The other two sticks 6111 is located on the cassette bracket for locking the wafers in horizontal direction. The contact point of the wafers and two sticks will have the bouncing defects in cleaning process. For reducing bouncing defects, the stick 6111 connected with the cover plate 6110 rotates as driving roller by rotating mechanism 6112, and the other sticks can rotate as slaving roller by driving roller to turn the wafers together, as FIG. 6A. The rotating mechanism 6112 has a magnetic part 6121, and the magnetic side 6121 is made of magnetic material. The magnetic part 6121 insets into the outer tank 6006, and the magnetic part 6121 has several partitions 6122 around it to form a confined space for avoid the chemical solution contacting the magnetic part 6121. The end of the stick 6111 connected with the cover plate near the magnetic part 6121 is made of magnetic material. The stick 6111 connected with the cover plate and the magnetic part 6121 use the magnetic material of the same characteristics. Turn the magnetic part 6121 to drive the stick 6111 rotation, through the rotation of the stick 6111 turns the wafer.

Figure 7:
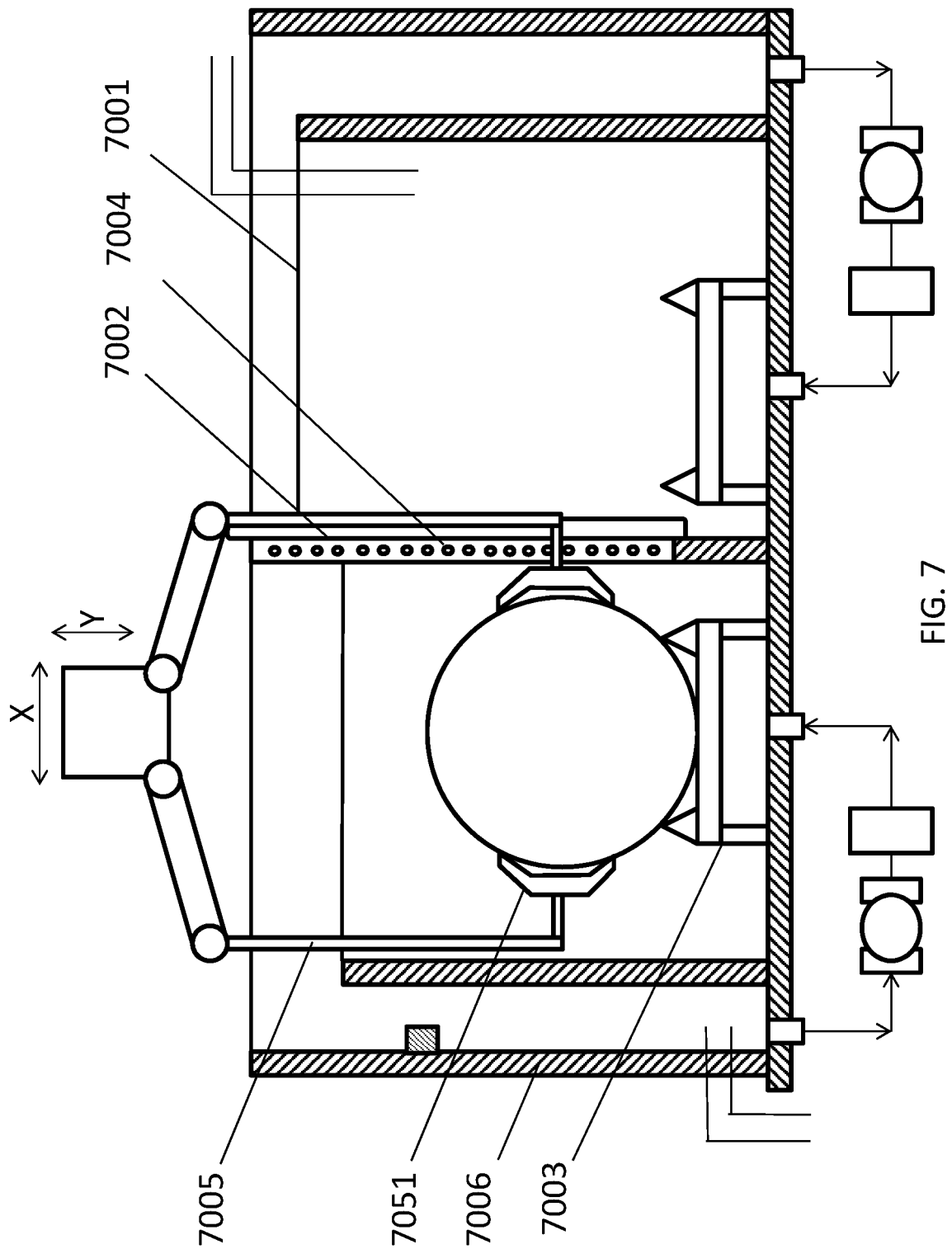
FIG. 7 depicts a cross sectional view showing another exemplary apparatus for cleaning semiconductor wafer according to the present invention.
Figure 8B:
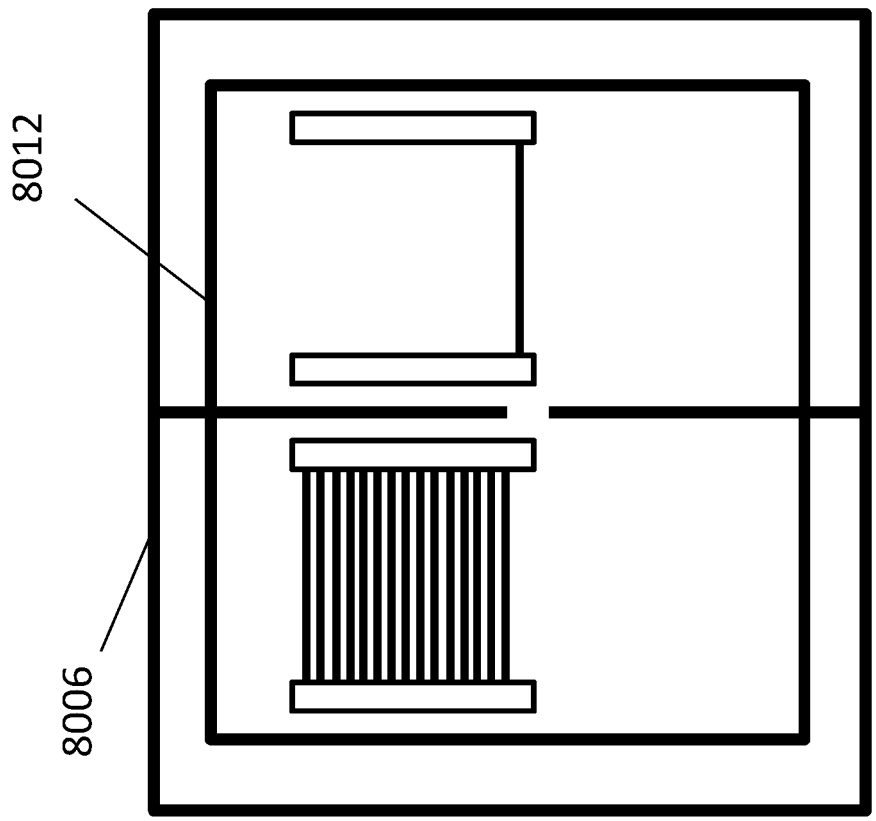
FIGS. 8A-8F depict an exemplary wafer cleaning method.
Figure 8A:
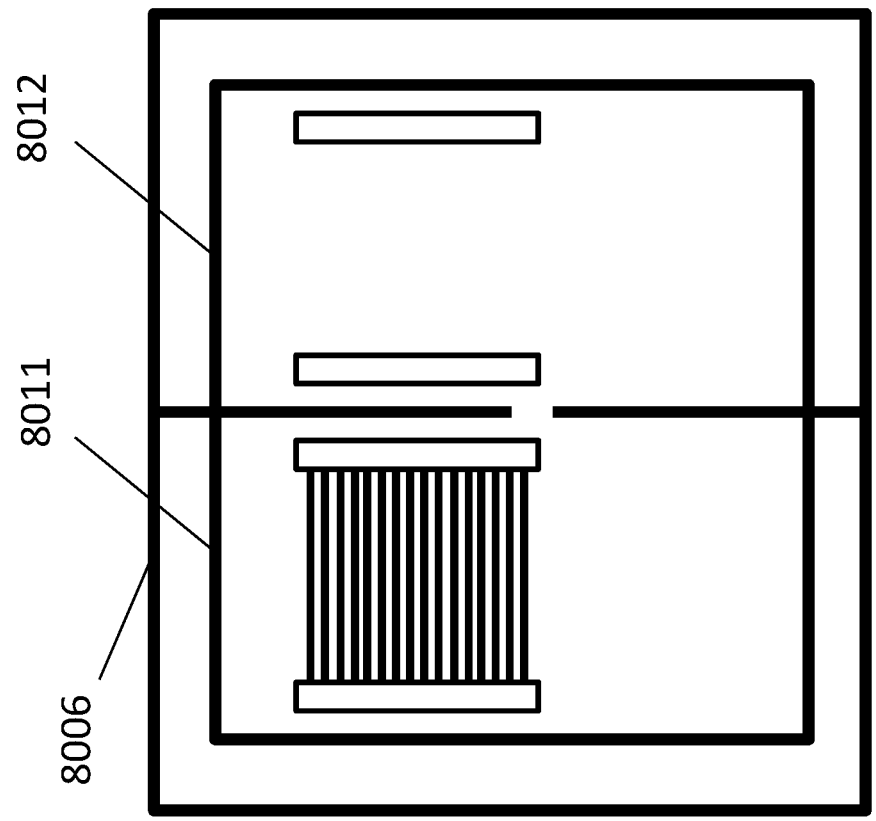
Figure 8D:
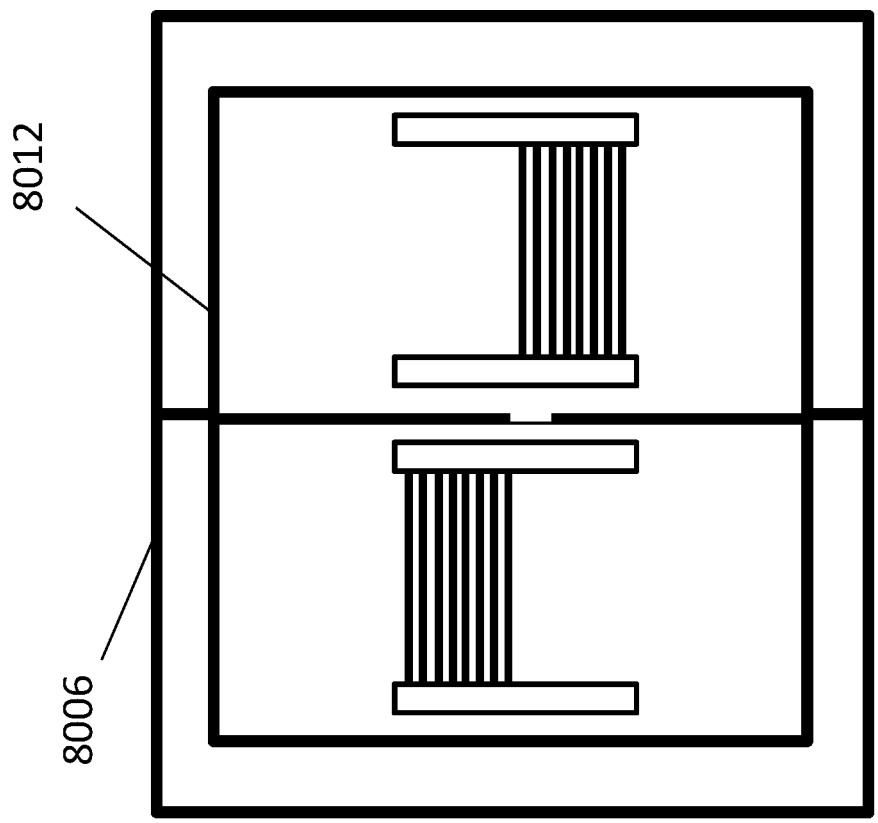
Figure 8C:
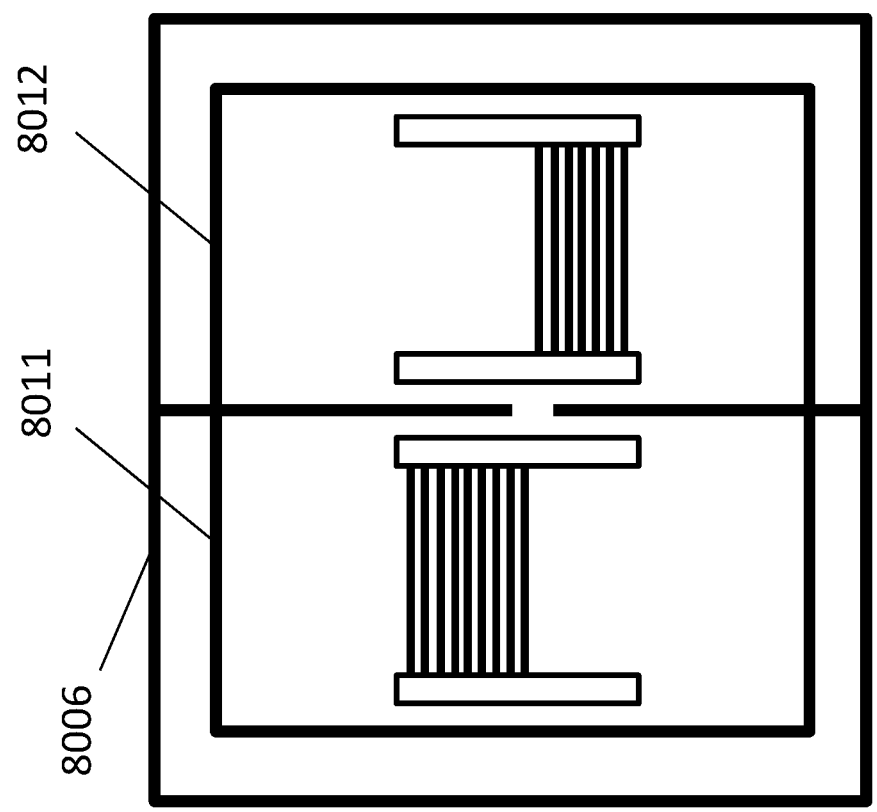
Figure 8F:
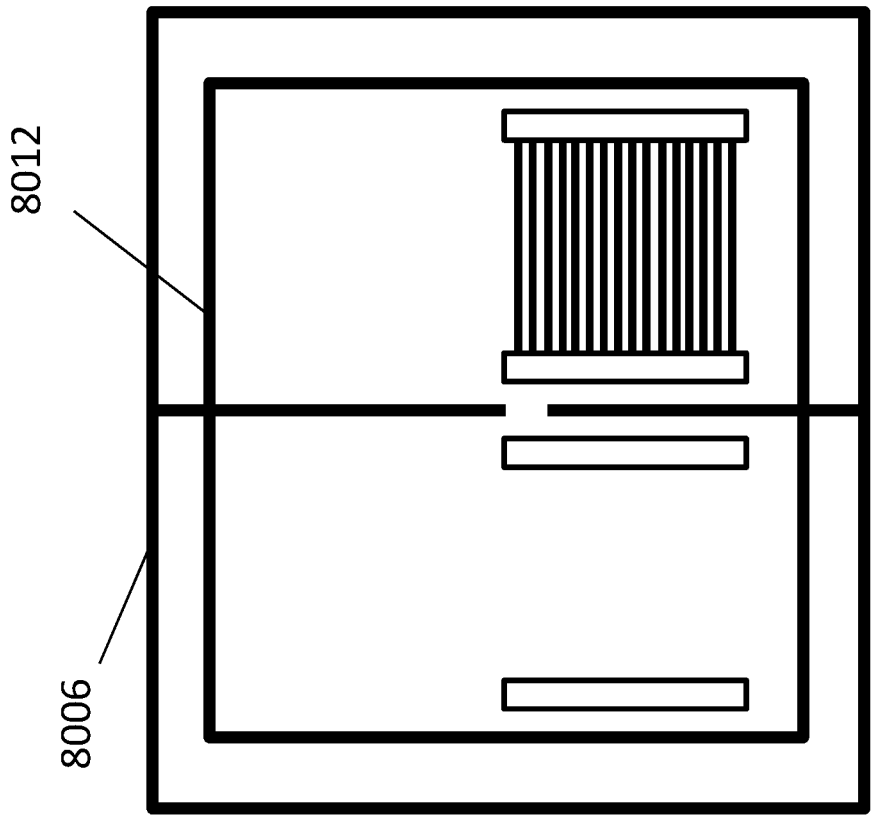
Figure 8E:
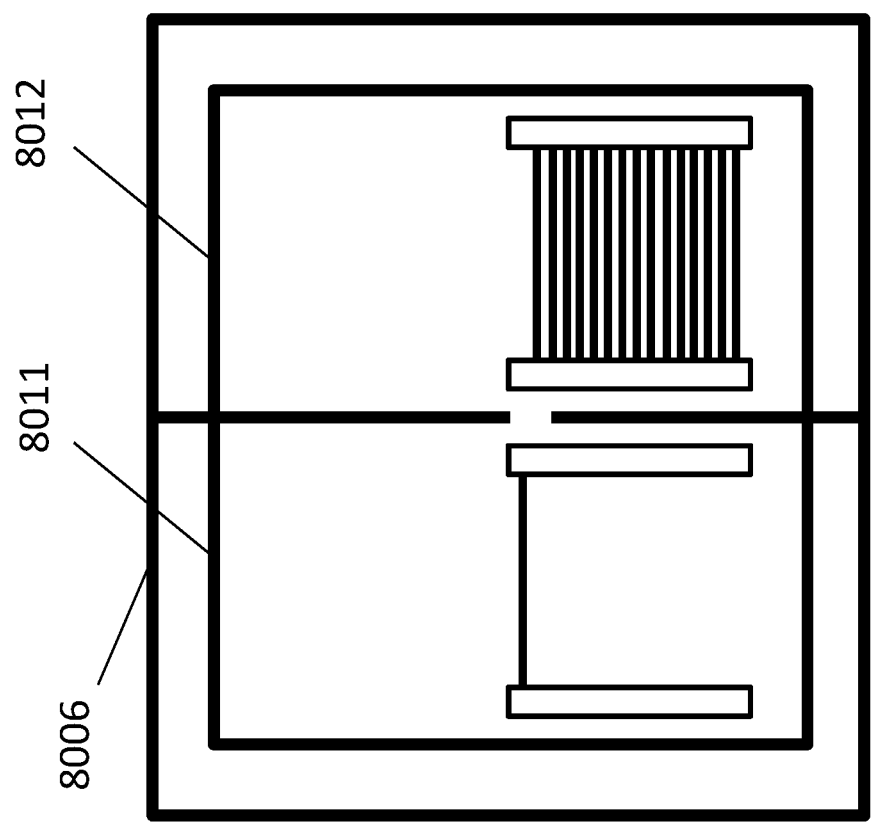

FIG. 7 depicts a cross sectional view showing another exemplary apparatus for cleaning semiconductor wafer according to the present invention. The apparatus for cleaning semiconductor wafer comprises an inner tank 7001 with one divider 7002 dividing the tank into two cleaning tanks filled with chemical solution; a cassette bracket 7003 located in the bottom of every cleaning tank for holding wafers; at least one slot 7004 in the divider 7002; a robot 7005 equipped with at least a pair of end effector 7051 for gripping and taking at least one wafer from the first cleaning tank to the second cleaning tank through the slot 7004 with the wafer immersing in the chemical solution. The slot 7004 cut through the upper divider 7002 that the robot 7005 can load and unload the wafers.

FIGS. 8A-8F depict an exemplary wafer cleaning method. An exemplary method for cleaning semiconductor wafer comprise:
- putting at least one wafer on the cassette bracket in a first cleaning tank 8011 filled with chemical solution;
- after said wafers have been processed in the first cleaning tank 8011, transferring the wafers from the first cleaning tank 8011 to a second cleaning tank 8012 with the wafers immersing in the chemical solution;
- after said wafers have been processed in the second cleaning tank 8012, taking the wafers out of the tank.

As shown in FIGS. 8A-8F, the transferring way of wafers is taking the wafers from the first cleaning tank 8011 to the second cleaning tank 8012 one by one. In transferring process, spray chemical solution to form a liquid curtain between the first cleaning tank 8011 and the second cleaning tank 8012.

FIGS. 9A-9C depict an exemplary wafer cleaning method. An exemplary method for cleaning semiconductor wafer comprise:
- putting at least one wafer on the cassette bracket in a first cleaning tank 9011 filled with chemical solution;
- after said wafers have been processed in the first cleaning tank 9011, transferring the wafers from the first cleaning tank 9011 to a third cleaning tank 9013;
- after said wafers have been processed in the third cleaning tank 9013, transferring the wafers from the third cleaning tank 9013 to a second cleaning tank 9012 with the wafers immersing in the chemical solution;
- after said wafers have been processed in the second cleaning tank 9012, taking the wafers out of the tank.

As shown in FIGS. 9A-9C, the transferring way of wafers is taking the all wafers from one cleaning tank to the other cleaning tank one time. In transferring process, spray chemical solution to form a liquid curtain between each two cleaning tanks.

Now, although the present invention has been described in detail above, it should be obvious to a person skilled in the art that the present invention is by no means limited to the embodiments described herein. The present invention can be implemented with various corrections and in various modifications, without departing from the spirit and scope of the present invention defined by the recitations of claims. Consequently, the description herein is provided only for the purpose of explaining examples, and should by no means be construed to limit the present invention in any way.

What is claimed is:

1. A method for cleaning wafer, comprising:
   - partially filling a first cleaning tank and a second cleaning tank with a chemical solution, wherein a height of liquid level of the first cleaning tank is lower than the height of liquid level of the second cleaning tank, the first cleaning tank and the second cleaning tank are divided by a divider between the first cleaning tank and the second cleaning tank;
   - putting at least one wafer on a cassette bracket in the first cleaning tank;
   - after the at least one wafer have been processed in the first cleaning tank, transferring the at least one wafer from the first cleaning tank to the second cleaning tank on another cassette bracket for holding the at least one wafer with the at least one wafer immersing in the chemical solution;
   - the chemical solution in the second cleaning tank flows to the first cleaning tank through a slot provided on the divider while transferring the at least one wafer from the first cleaning tank to the second cleaning tank;
   - after the at least one wafer have been processed in the second cleaning tank, taking the at least one wafer out of the second cleaning tank; and
   - wherein the step of transferring the at least one wafer from the first cleaning tank to the second cleaning tank with the at least one wafer immersing in the chemical solution comprises, transferring the at least one wafer from the first cleaning tank to the second cleaning tank through the slot provided on the divider.

2. The method as claimed in claim 1, wherein the height of the divider is higher than a height of the first cleaning tank and the second cleaning tank.

3. The method as claimed in claim 1, further comprising spraying the chemical solution to form a liquid curtain between the first cleaning tank and the second cleaning tank.

4. The method as claimed in claim 3, wherein at least one side wall of the slot has an array of nozzles for spraying the chemical solution to form the liquid curtain, and the step of spraying the chemical solution to form the liquid curtain between the first cleaning tank and the second cleaning tank further comprises supplying the chemical solution sprayed from the nozzles from the second cleaning tank to form the liquid curtain.

5. The method as claimed in claim 1, wherein the chemical solution is SPM, and the temperature of SPM is in a range of 80° C.-250° C.

6. The method as claimed in claim 5, wherein SPM is the mixture of $H_2SO_4$ and $H_2O_2$, and a ratio of $H_2O_2$ to $H_2SO_4$ is 1:1 to 1:100.

7. The method as claimed in claim 1, wherein the chemical solution in the first cleaning tank has a same temperature with the chemical solution in the second cleaning tank.

8. The method as claimed in claim 1, wherein the chemical solution in the first cleaning tank has a different temperature with the chemical solution in the second cleaning tank.

9. The method as claimed in claim 1, wherein the chemical solution in the first cleaning tank has a same concentration with the chemical solution in the second cleaning tank.

10. The method as claimed in claim 1, wherein the chemical solution in the first cleaning tank has a different concentration with the chemical solution in the second cleaning tank.

11. The method as claimed in claim 1, further comprising allowing the chemical solution to overflow from each cleaning tank to an outer tank, and recycling the chemical solution back to the cleaning tank by a pumping system.

12. The method as claimed in claim 11, wherein the height of the first cleaning tank is lower than the height of the second cleaning tank.

13. The method as claimed in claim 12, wherein the second cleaning tank has an inlet for supplying the chemical solution, and the outer tank has a sensor and a drain under the sensor, and the method further comprises a step of detecting liquid level of the chemical solution in the outer tank through the sensor.

14. The method as claimed in claim 1, wherein the chemical solution in the second cleaning tank is fresher than chemical solution in the first cleaning tank.

15. The method as claimed in claim 1, further comprising holding down the at least one wafer through a wafer holder stick connected to a tank cover.

16. The method as claimed in claim 15, further comprising holding up the at least one wafer through another two wafer holder sticks on the cassette bracket.

17. The method as claimed in claim 16, further comprising rotating at least one of the wafer holder sticks as driving roller by rotating mechanism, and the other wafer holder sticks are rotated as slaving rollers.

* * * * *